(12) United States Patent
Tsui et al.

(10) Patent No.: US 8,232,626 B2
(45) Date of Patent: Jul. 31, 2012

(54) VIA AND METHOD OF VIA FORMING AND METHOD OF VIA FILLING

(75) Inventors: Yat Kit Tsui, Tuen Mun (HK); Dan Yang, Fanling (HK); Xunqing Shi, Taiwai (HK)

(73) Assignee: Hong Kong Applied Science & Technology Research Institute Co. Ltd., Shatin, New Territories (HK)

( * ) Notice: Subject to any disclaimer, the term of this patent is extended or adjusted under 35 U.S.C. 154(b) by 240 days.

(21) Appl. No.: 12/814,938

(22) Filed: Jun. 14, 2010

(65) Prior Publication Data

US 2011/0304026 A1    Dec. 15, 2011

(51) Int. Cl.
*H01L 29/40* (2006.01)
*H01L 21/44* (2006.01)
*H05K 1/11* (2006.01)

(52) U.S. Cl. ......... 257/621; 257/E21.597; 257/E23.011; 438/667; 174/262; 205/123

(58) Field of Classification Search .................. 257/621, 257/E21.597, E23.011; 438/667; 174/262; 205/123

See application file for complete search history.

(56) References Cited

U.S. PATENT DOCUMENTS

| | | | |
|---|---|---|---|
| 6,613,664 B2* | 9/2003 | Barth et al. | 438/629 |
| 6,933,172 B2 | 8/2005 | Tomimatsu | |
| 8,008,199 B2* | 8/2011 | Baker-O'Neal et al. | 438/687 |
| 2009/0085173 A1* | 4/2009 | Boemmels et al. | 257/635 |
| 2010/0143649 A1* | 6/2010 | Edelstein et al. | 428/138 |

* cited by examiner

*Primary Examiner* — David S Blum
(74) *Attorney, Agent, or Firm* — Stites & Harbison PLLC; Douglas E. Jackson

(57) ABSTRACT

An electronic or micromechanical device having first (11) and second (12) surfaces and a via extending through the device from the first surface to the second surface. The via comprises integrally formed first (84, 86), second (82) and third (88) portions. The first portion (84, 86) extends from the first surface (11) to the second surface (12). The second portion (82) extends over a part of the first surface (11) of the device. The third portion (88) extends over a part of the second surface (12) of the device. Preferably the first portion comprises first and second parts, the second part extending through an active region of the device and having a narrower width than the first part. A method of forming and filling the via is also disclosed.

22 Claims, 23 Drawing Sheets

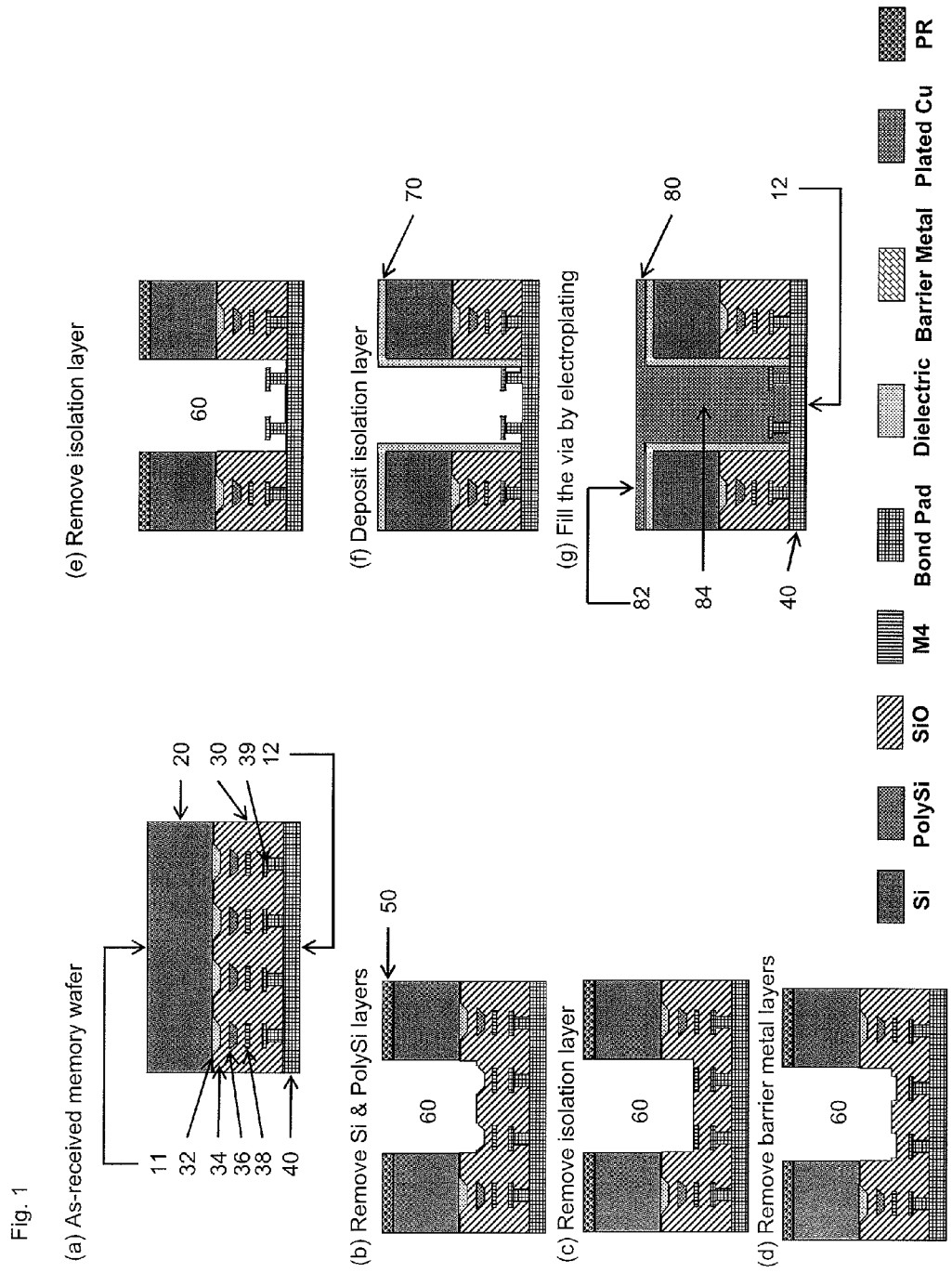

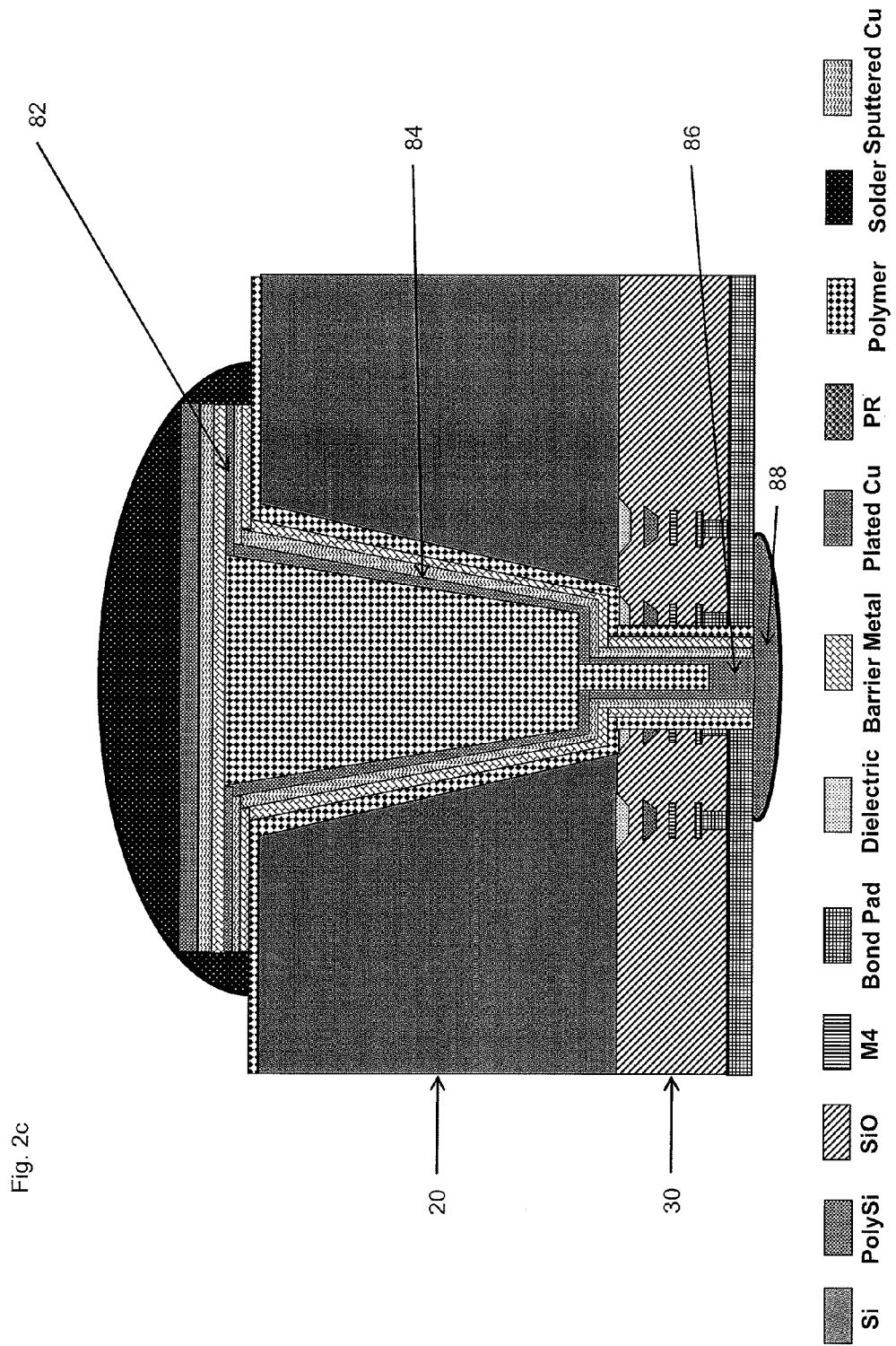

Fig. 4
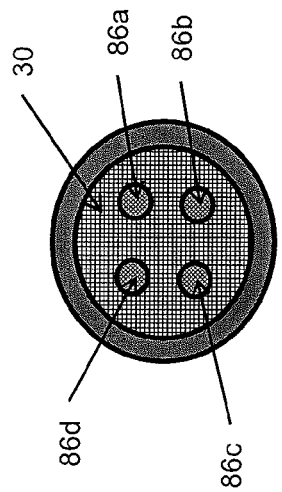
(a) A Point Opening on Original Bond Pad
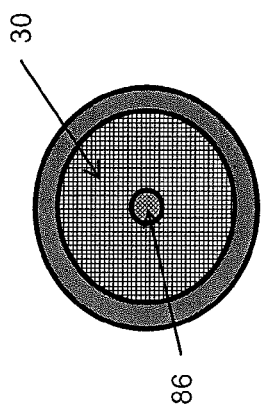
(b) Multi-points Openings on Original Bond Pad
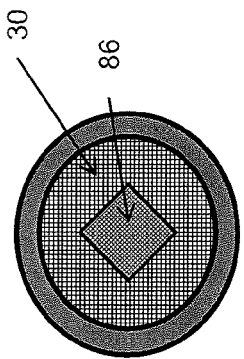
(c) A Polygon Opening on Original Bond Pad
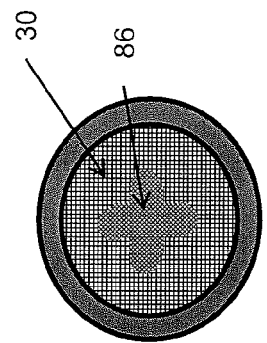
(d) An Irregular Opening on Original Bond Pad
Si    Bond Pad    Plated Cu

VIA AND METHOD OF VIA FORMING AND METHOD OF VIA FILLING

FIELD OF THE INVENTION

The present invention relates to a via and a method of via forming and method of via filling, especially but not limited to a through-silicon-via (TSV).

BACKGROUND

With electronic devices, particularly portable devices such as mobile phones, becoming smaller and yet at the same time offering a wider range of functions, there is a need to integrate multifunctional chips but without increasing the size of the devices and keeping a small form factor. Increasing the number of electronic components in a 2D structure is incompatible with these objectives, and therefore 3D packages are increasingly being adopted in order to provide greater functionality and higher component density but with a small form factor.

In a 3D structure electronic components such as semiconductor chips with different active IC devices may be provided in a multilayer stacked structure. Traditionally wire bonding (e.g., U.S. Pat. No. 6,933,172) is used to establish electrical interconnects between chips, but wire bonding requires greater in-plane size and out-of-plane size and is inconsistent with the objective of maximizing the component density. To connect electrically the components in different layers through-silicon-via (TSV) technology may be used to provide the electrical interconnect and to provide mechanical support. In TSV technology a via is fabricated in a silicon chip with different active IC devices or other devices fabricated by a semiconductor process and the via is filled with metal such as Cu, Au, W, solders, or a highly-doped semiconductor material such as polysilicon. The TSV can thus link bond pads on the top surface of the component with bond pads on the bottom surface of the component. Multiple components provided with such vias are then stacked and bonded together. Further important electrical paths through the electronic device can be shortened thus leading to faster operation.

While TSVs are frequently applied to electronic components they may also be applied to micromechanical components, such as MEMs devices.

FIGS. 1 (a) to (g) shows steps in a conventional method of forming a TSV for a NAND flash memory wafer.

In the step of FIG. 1 (a) the electronic device (in this case a memory wafer) is provided. The wafer has a first 'upper' surface 11 and a second 'lower' surface 12 opposite the first surface. The wafer comprises a silicon region 20 at an upper part of the wafer and an active region 30 at a lower part of the wafer. The active region comprises a bond pad 40. More particularly, in the illustrated example, the active region 40 comprises a plurality of electrical traces and/or conductive lines embedded in an isolation layer (e.g. SiO) 34 between the silicon region 20 and the bond pad 40. In the illustrated example, the active region 30 comprises a plurality of dielectric lines 32, polysilicon lines 36, and M4 lines 38 embedded in a silicon oxide isolation layer 34 between the silicon layer 20 and the bond pad 40. The bond pad is formed of metal and has a plurality of extending portions 39 which extend upwards into the silicon oxide region. The portions 39 may have particular structures and in the illustrated example these upwardly extending portions are T shaped, with the cross of the T being at the end remote from the bond pad.

FIGS. 1 (b) to 1(f) illustrate the method of forming the via-hole. In the step of FIG. 1 (b) a photo-resist layer 50 is added to protect parts of the device which are not to be etched; and a portion of the silicon layer 20 and a portion of the polysilicon layer 32 are removed by etching. In the step of FIG. 1 (c), a portion of the isolation layer 34 is removed by etching. In the step of FIG. 1 (d), a portion of the barrier metal layer M4 is removed by etching. In the step of FIG. 1 (e), a portion of the silicon oxide isolation layer is removed by etching. As can be seen in FIGS. 1 (b) to (e), the various layers are removed in separate etching steps. As the removed materials are different, a different etching process is needed for each. Furthermore, the width of etching in each step is substantially the same so that the via has a substantially uniform width. The fully formed via-hole 60 is shown in FIG. 1 (e). It extends from the top surface 11 of the device down to the bond pad 40 and has a substantially uniform width or diameter. However, the via-hole 60 does not extend through the bond pad 40.

In the step of FIG. 1 (e) an isolation layer 70 comprising a dielectric material is deposited inside the via-hole 60. The isolation layer 70 covers the inner sidewalls of the via-hole and extends over the top surface 11 of the silicon layer 20. In the step of FIG. 1 (g), electroplating is carried out to fill the via-hole with metal 82, 84. Usually the metal will be copper. The metal layer 82, 84 is solid and forms a T-shape. It comprises a vertical portion 84 in the via-hole and a horizontal or 'cross' portion 82 extending over the top surface 11 of the device. The bottom of the vertical portion of the electroplated metal 84 is in mechanical and electrical contact with the bond pad 40, but it is not integrally formed with the bond pad. That is, the via does not extend through the bond pad 40 and does not reach the second surface of the device 12. Even if the bond pad 40 and the electroplated layer 82, 84 are both made of copper, the two are not integral. They are separate pieces having different grain structures as a result of their different methods of manufacture (as the bond pad 40 is not formed by electroplating).

Forming the TSV in the above manner is a time consuming process as the etching has to be carried out in several different steps. Further, some of the etching steps should be carried out in different chambers or after evacuation of the room, in order to prevent contamination. This increases both the complexity of the method and the time required, thus increasing the cost of manufacture. Further, the above method may not always securely attach the electroplated layer 82, 84 to the bond pad or the side walls of the via-hole. This causes problems if stresses are applied to the device in manufacture or during use. Therefore, it is desirable to find faster and more cost efficient methods of forming vias and methods which ensure their mechanical integrity.

SUMMARY OF THE INVENTION

A first aspect of the present invention provides an electronic or mircomechanical device having first and second surfaces and a via extending through the device from the first surface to the second surface; the via being generally I-shaped. The I-shaped nature of the via helps to secure the via to the device.

The via preferably comprises an integrally formed layer of conductive material (e.g. metal). A further conductive layer may be provided on top of the via, over the second surface of the device; a barrier layer may be provided between the via and the further conductive layer. The top and bottom of the I-shape (or the further conductive layer) may form electrical contacts for connecting the device with another device above or below said device. Solder may be added on top of the contacts.

A second aspect of the present invention provides an electronic or mircomechanical device having first and second surfaces and a via extending through the device from the first surface to the second surface; the via comprising integrally formed first, second and third portions; the first portion extending from the first surface to the second surface; the second portion extending over a part of the first surface of the device and the third portion extending over a part of the second surface of the device. This configuration helps to secure the via to the device.

The via thus comprises an integrally formed conductive layer. A further conductive layer may be provided on top of the via, over the first portion of the via; a barrier layer may be provided between the via and the further conductive layer.

The second and first portions of the via may (or the further conductive layer) may form electrical contacts for connecting the device with another device above or below said device. Solder may be added on top of the contacts.

The via may further comprise one or more of a barrier layer, filler layer, sputtered metal layer and dielectric layer, each extending through the non-active region and at least part of the active region of the device.

A third aspect of the invention provides a method of forming a via extending through an electronic or micromechanical device having a first surface and a second surface; the method comprising forming a via hole extending all the way through the device from the first surface to the second surface and electroplating to add an integrally formed metal layer extending through said via hole from said first surface to said second surface; said integrally formed metal layer comprising a portion which extends over part of said first surface of the device and a portion which extends over a part of said second surface of the device.

A fourth aspect of the present invention provides an electronic or mircomechanical device having first and second surfaces and a via extending through the device from the first surface to the second surface; wherein the device has a non-active layer and an active layer and wherein the a first part of the via extends through the non-active layer and a second part of the via extends primarily through the active layer; the first part of the via having a greater width than the second part of the via. As the second part of the via is narrower this helps to reduce damage to the active layer of the device.

The first and/or second parts of the via may be tapered so that they have a decreasing width in the direction from the first surface of the device to the second surface of the device. This helps facilitate bottom up electroplating during manufacture of the device.

A fifth aspect of the invention provides a method of forming a via extending through an electronic or micromechanical device; the method comprising forming a first part of a via hole by etching and a second part of a via hole by laser drilling. As there is only one etching step and as the laser is only used in the second step, but does not have to cut all the way through the device, the process is relatively quick. Preferably the second removed portion has a narrower width than the first portion.

The device preferably has first and second opposite surfaces and the via preferably extends all way through the device from the first surface to the second surface. In particular, the via preferably extends through an active region of the device, which may comprise a bond pad.

A sixth aspect of the present invention provides a stacked assembly comprising a first device mounted on top of a second device; at least one of said first and second devices being a device according to the first, second or fourth aspects of the present invention or manufactured according to the third or fifth aspect of the present invention.

BRIEF DESCRIPTION OF THE DRAWINGS

FIG. 1 (*a*) to (*g*) show steps in conventional method of forming a TSV and have already been described;

FIGS. 4 (*a*) to (*d*) show cross-sections of the lower part of the via according to various embodiments of the present invention;

DETAILED DESCRIPTION

Figure 2A:
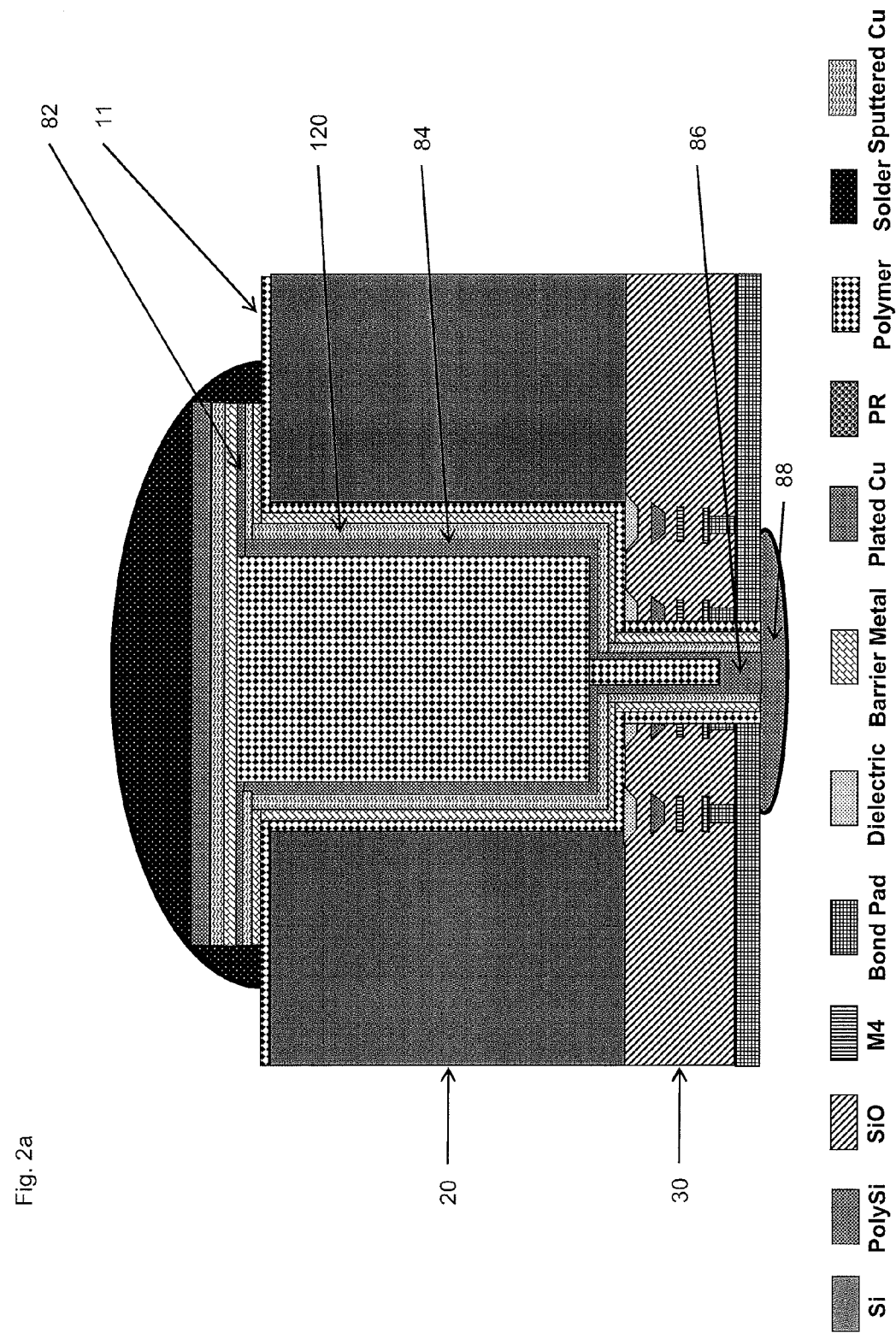
FIGS. 2 (*a*) to (*d*) are schematic diagrams of vias according to embodiments of the present invention.
Figure 2B:
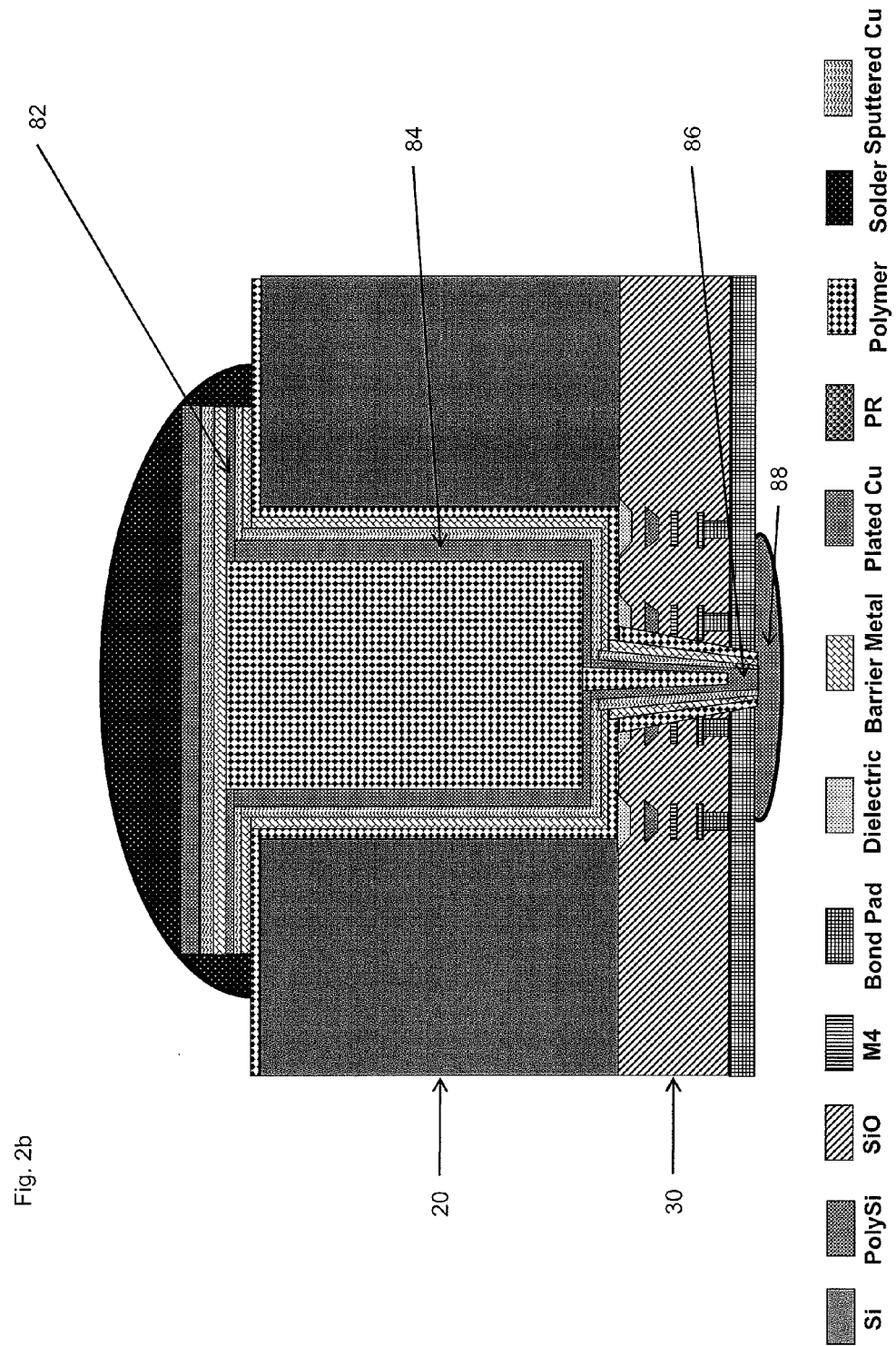
Figure 2D:
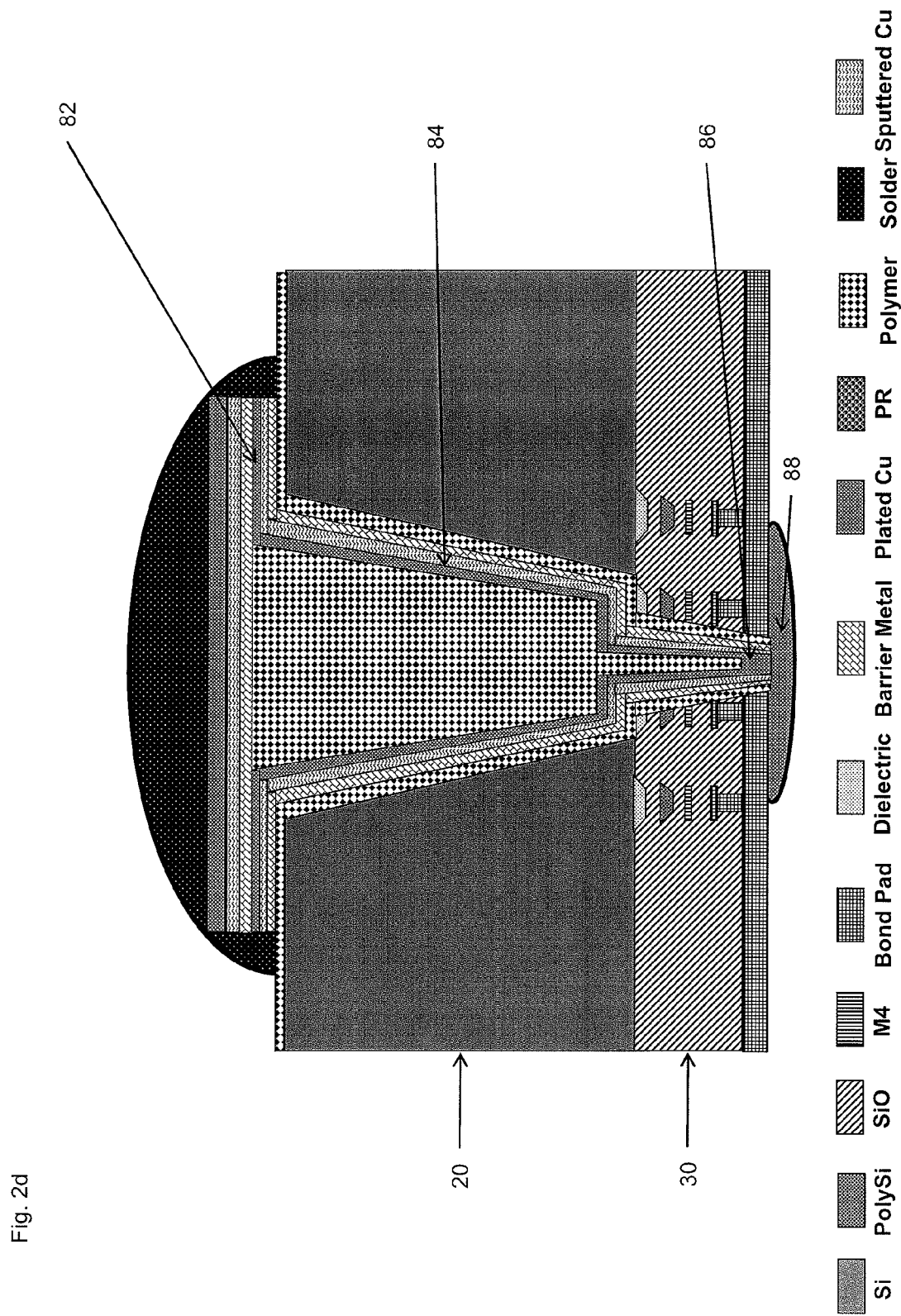

FIGS. 2 (*a*) to (*d*) are schematic diagrams of vias according to embodiments of the present invention. The via extends all the way through a substrate. The substrate may be an electrical device or a mechanical device. For example, the device may be a memory chip, a processor or a MEMs device, but the present invention is not limited to those examples. Usually the substrate comprises silicon.

The via extends through the substrate from a first surface 11 to an opposite second surface 12. The via is generally I-shaped. It comprises a metal layer having first 84, 86, second 82 and third 88 portions integrally formed by electroplating. The second portion 82 extends over the first surface 11 of the substrate. The first portion 84, 86 extends through the substrate and the third portion 88 extends over the second surface of the substrate. As the three portions of the via are integrally formed as one piece, this gives the structure mechanical integrity. As the electroplated portions of the via are integrally formed they have substantially the same grain size; this is in contrast to the FIG. 1 arrangement in which the T-shaped via 84 is not integrally formed with the bond pad 40; thus in FIG. 1 even if the bond pad 40 and via 84 are made of the same material, they are not integrally formed and the bond pad and via 84 have different internal structures and grain sizes. In contrast, the arrangement in FIG. 1 (*g*) is less secure as the bond pad 40 may become detached from the via 84.

Figure 3:
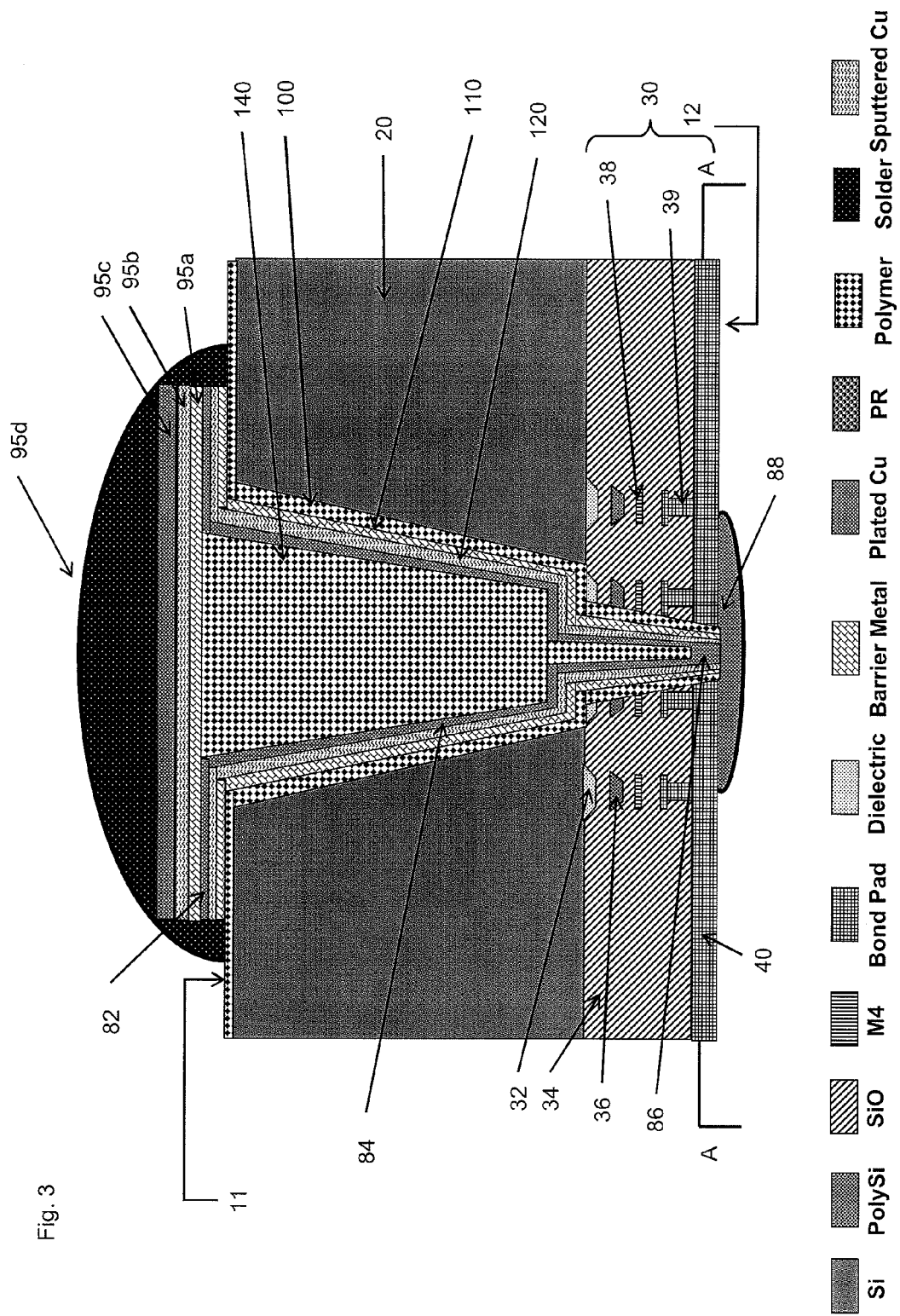
FIG. 3 shows a via in more detail.

The 'I-shape' of the via in FIGS. 2 (*a*)-(*d*) and FIG. 3 keeps the via firmly attached to the substrate and the bond pad. As the second and third portions of the via are on opposing sides of the substrate and integrally formed with the connecting first portion of the via, the mechanical integrity of the structure is enhanced.

All three portions of the via comprise a metal layer, which will usually be Cu due to its low cost and excellent conductive properties. However, the present invention is not limited to Cu and any suitable metal may be used. For example, Au and W are possible alternatives and others will be apparent to a person skilled in the art.

The first portion of the via 84, 86 extends through device from the first surface 11 to the second surface 12. The first portion of the via comprises two parts. The first part 84 is wider than the second part 86. By wider it is meant that the first part has a larger diameter or larger cross-sectional area (in the direction perpendicular to the vertical length of the via extending from the first 11 to second surface 12). The contrast in size between the two parts can be seen from the width in the direction left to right in FIG. 2 (*a*). The first part 84 extends through a non-active region 20 of the device, while the second part 86 extends mostly through an active region 30 of the device. The active region may comprise a bond pad. As the cross-sectional area of second part 86 extending through the active region is relatively smaller than the cross sectional area of the first part 84, this minimises damage to the active region 30.

One or both of the first and second parts may be tapered. Preferably the first part 84 is tapered so that it is wider (has a larger cross sectional area) at the end near first surface 11 than the end near the active region 30. Preferably the second part 86 is tapered so that it is thinner (smaller cross sectional area) at the end near the second surface 12, than the end near the non-active region 20.

In FIG. 2 (*d*) and FIG. 3 both first 84 and second 86 parts are tapered as described above. These tapers have two main advantages in the manufacturing process. The first advantage is that the bottom part of the via hole (the part near surface 12) can be filled more quickly when electroplating as the required volume of metal is smaller. This helps the bottom up electroplating process. The second advantage is that the larger opening at the junction between the active and non-active layers together with the inclined via sidewall surface in region 30 enhances the uniformity of sputtered thin film metal 120.

This taper is not essential and it is possible to have other configurations in which neither or only one of the first and second parts are tapered. See FIGS. 2 (*a*) to 2 (*c*). In FIG. 2 (*a*) neither part is tapered. In FIG. 2 (*b*) the second part 86 is tapered. In FIG. 2 (*c*) the first part 84 is tapered.

Preferably the via comprises an electroplated metal layer surrounding a polymer filler. This metal-polymer-metal structure helps to compensate for the different coefficients of thermal expansion of the non-active region 20 of the substrate (usually formed of silicon) and the electroplated metal layer (usually made of copper). Typically the coefficient of thermal expansion of the electroplated metal is much greater than the coefficient of thermal expansion of the non-active region 20. The simple presence of the filler helps to reduce the problems caused by the differences in coefficients of thermal expansion, first by reducing the volume of the electroplated layer and second by having an intermediate co-efficient of thermal expansion itself. Further, the filler layer has a degree of resilience. Therefore, if the electro-plated layer expands, due to a change in temperature, this expansion can be accommodated by a 'squashing' of the filler layer. In this way, extra stresses which may lead to cracking or damage to the non-active and active layers of the device can be minimised or avoided.

FIG. 3 is a schematic diagram showing a via according to the present invention in more detail. The via extends all the way through a device substrate from the first surface 11 to the second surface 12. The device comprises a non-active silicon layer 20 and an active layer 30. The active layer 30 comprises a bond pad 40 and a silicon oxide isolation layer 34 between the bond pad 40 and the non-active layer 20. A plurality of traces, conductive paths and other structures are embedded in and extending through the isolation layer 34. In the illustrated example these traces include dielectric lines 32, polysilicon lines 36 and M4 lines 38. A plurality of structures 39 extend from the bond pad 40. These various structures in the active layer may be used to transmit an electrical signal from the bond pad to a logic gate or other part of the device. The structures may form an ESD (electrostatic discharge) protection structure.

The via comprises a wider first part which extends through the non-active layer and a narrower second part which extends through the active layer. As the second part is narrower it does less damage to the various structures in the active layer.

The various layers of the via will now be described, from the outside inwards. the via has an outer polymer layer 100, a barrier layer 110, a sputtered metal (e.g. copper) layer 120, an electroplated (e.g. copper) layer 84 and an inner polymer layer 140. Each of these layers has a first part extending through the non-active region of the device and a second narrower part extending through the active region of the device. The first and second parts are tapered in the illustrated example, but this is not essential and non-tapered or only partially tapered arrangements may be used as shown in FIGS. 2 (*a*) to (*c*).

The via is generally I-shaped and the electroplated layer has first 84, 86, second 82, and third 88 portions as described above. These portions are integrally formed. The upper surface 11 of the device is topped with a part 95 which comprises a barrier layer 95*a*, a sputtered metal layer 95*b*, an electroplated layer 95*c* and solder 95*d*.

Preferably the second part of the first portion of the via 86 comprises a single 'leg' which extends through the active region. This is as shown in FIG. 3 and FIG. 4 (*a*), which is a cross section along the line A-A of FIG. 3. For simplicity only the electroplated part of the via 86 and the active region 30 are shown in the cross-section. A silicon portion 20*a* surrounding the via (not shown in FIG. 3) is also depicted in FIGS. 4 (*a*) to (*d*). Preferably the via has a circular cross section as shown in FIG. 4 (*a*). However, it would be possible to have different shapes of cross section, for example as shown in FIG. 4 (*c*) or (*d*). Further, there could be a plurality of 'legs' extending down through the active region—for example, as shown by 86*a* to 86*d* of FIG. 4 (*b*).

A method of forming the via will now be described.

Figure 5:
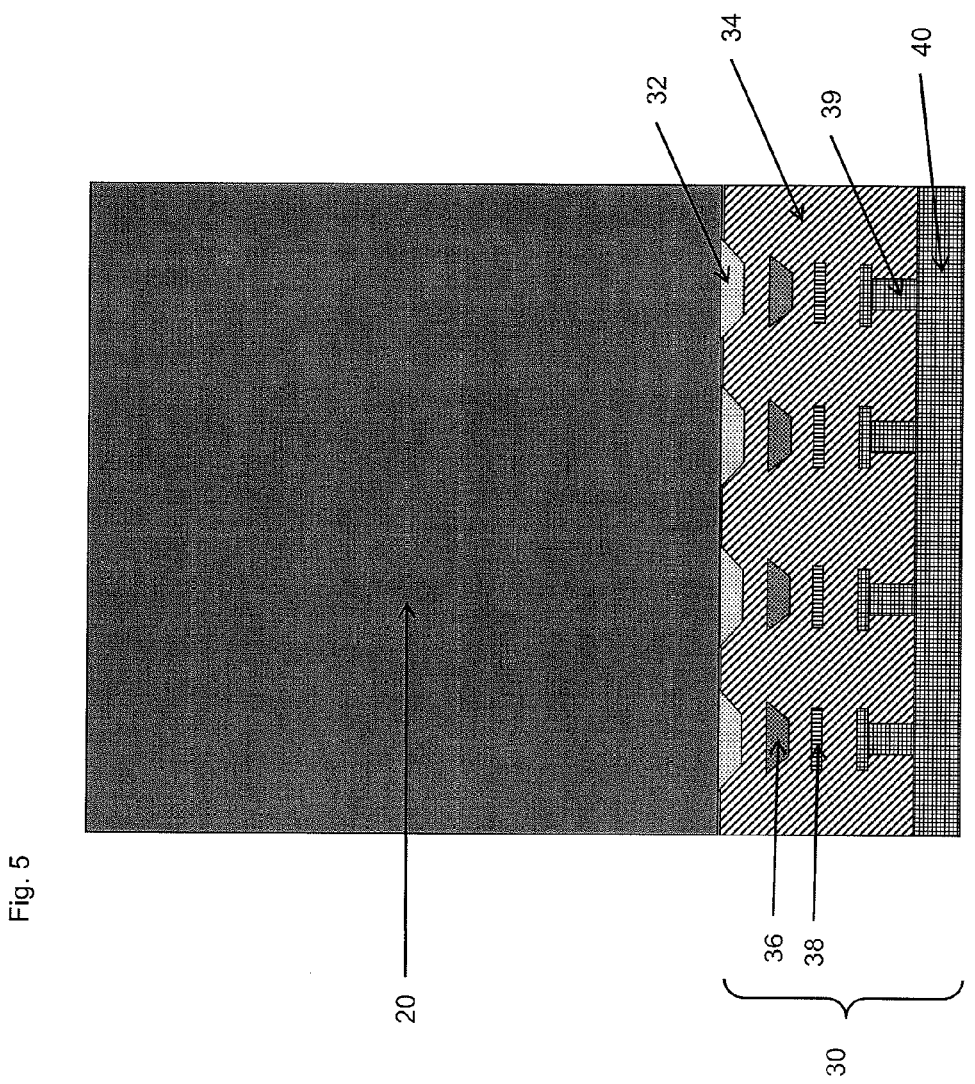
FIGS. 5 to 19 shows steps in the method of forming the via of FIG. 3.

FIG. 5 shows the electronic device wafer before the via is formed. It comprises the same parts as described previously and the same reference numerals are used. In the illustrated example the device is a memory wafer, but the method may be applied to processors, other electronic devices and micromechanical devices also.

Figure 6:
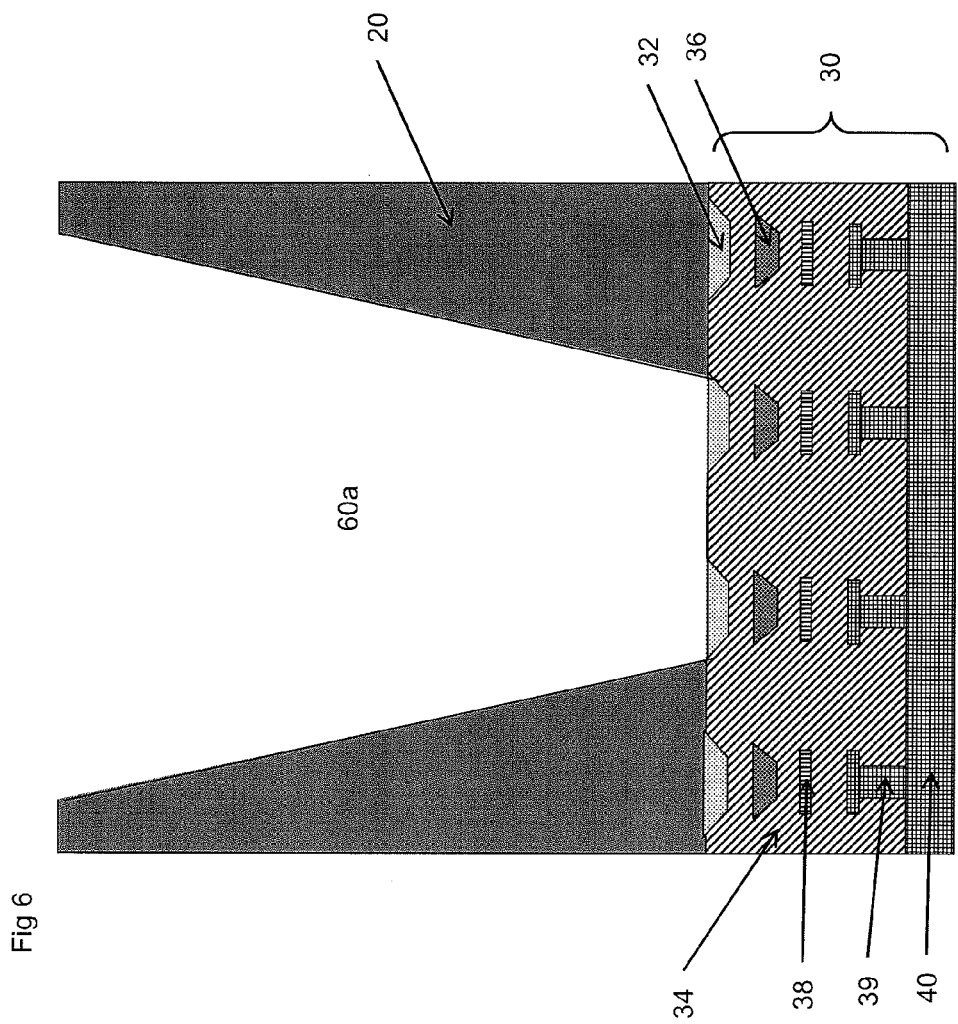
Figure 7:
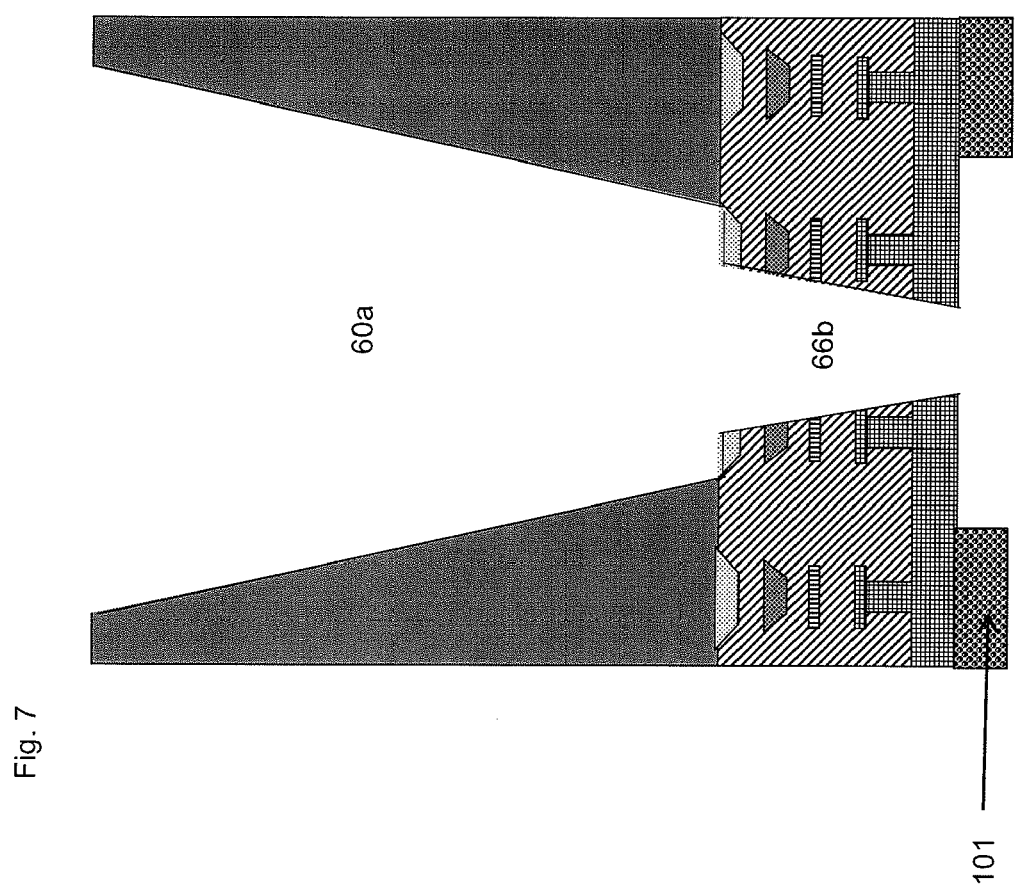

In FIGS. 6 and 7 the via-hole is formed in two steps. In the first step, shown in FIG. 6, a portion of the non-active layer is removed by an etching method, such as RIE (reactive ion etching). Only one etching process is needed. Preferably the via hole is tapered to be wider at the top (near first surface 11), although this is not essential. In FIG. 7 a second part of the via hole is formed by laser drilling. That is the active region is drilled by laser. The size of the second part of the via hole is determined by the size adjustable laser beam used for drilling. The resulting via hole (including first part 60*a* and second part 60*b*) extends all the way through the device from the first surface 11 to the second surface 12. A photo resist 101 is added to the second surface 12 of the device to protect the surface of the bond pad 40.

Figure 8:
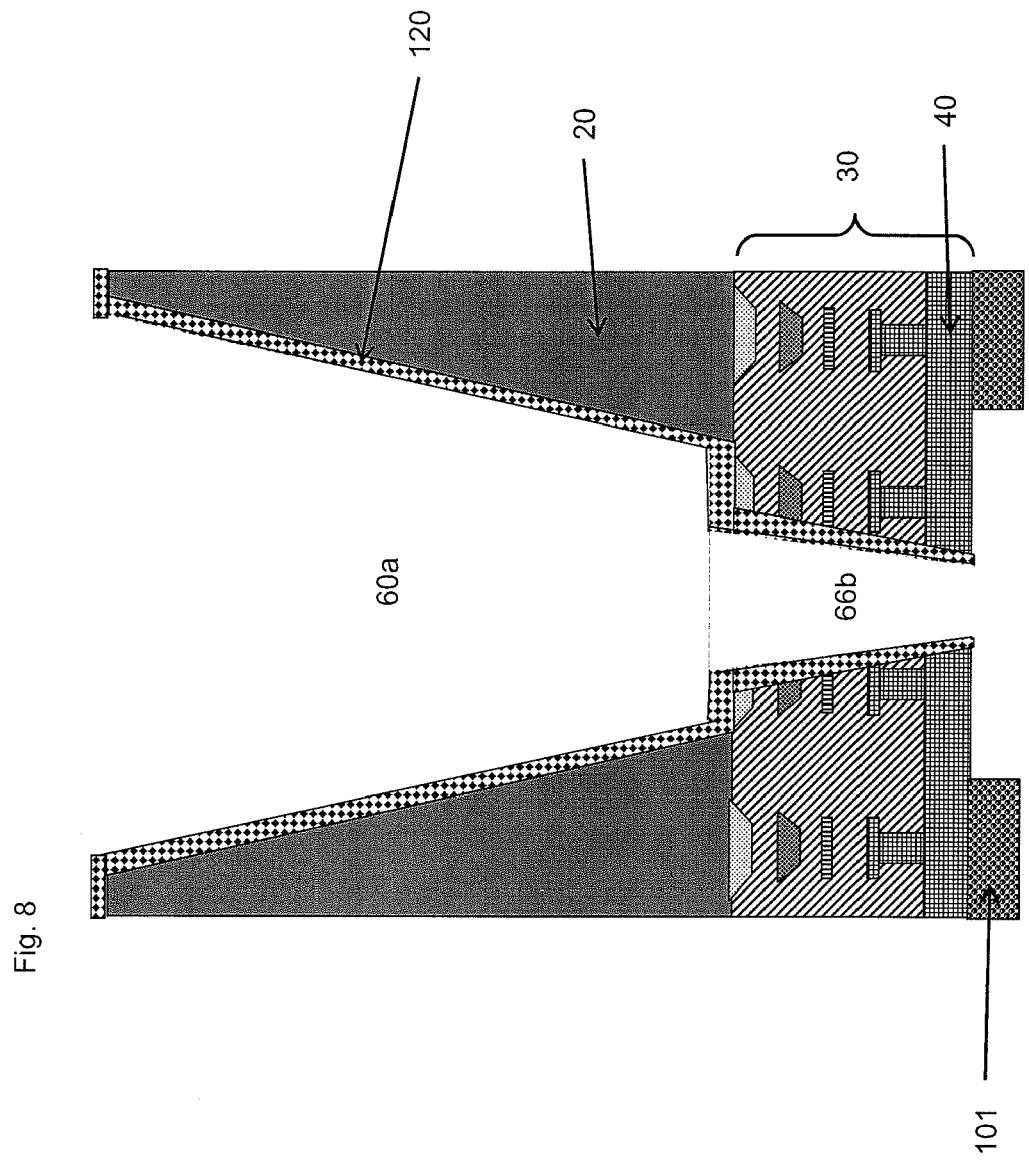
Figure 9:
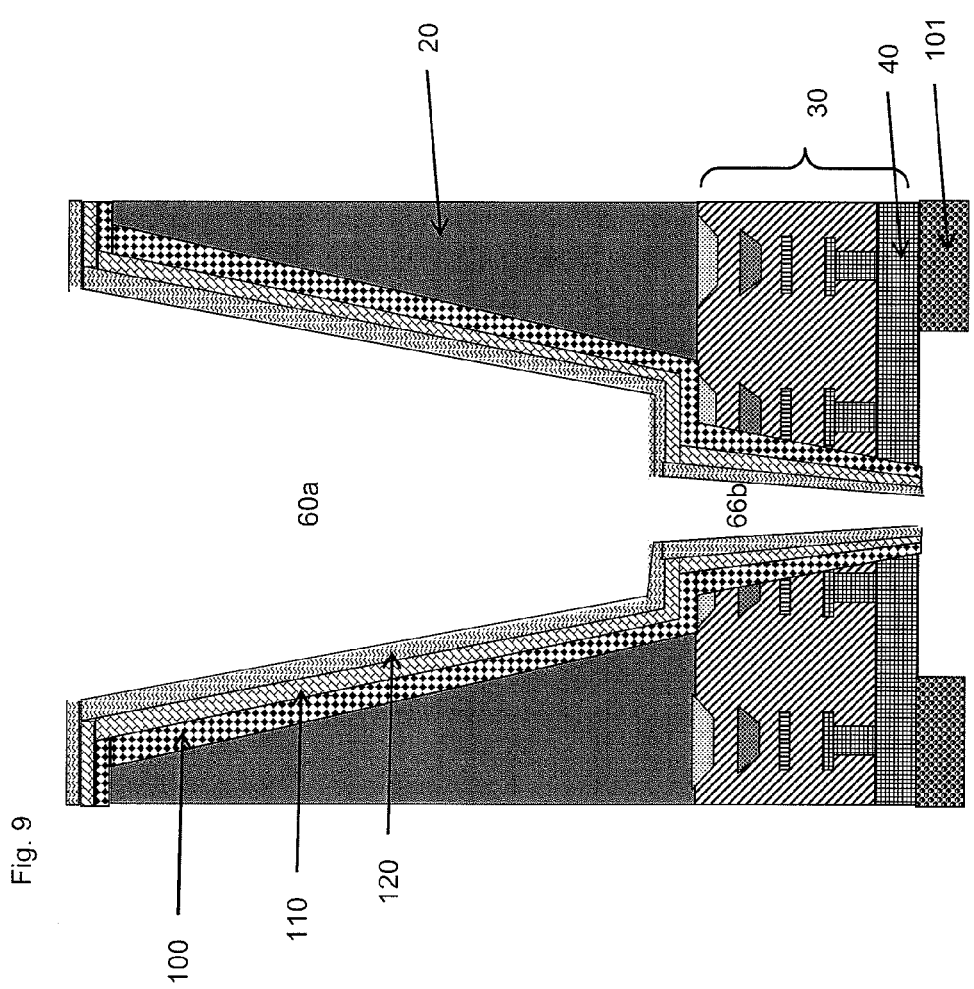
Figure 10:
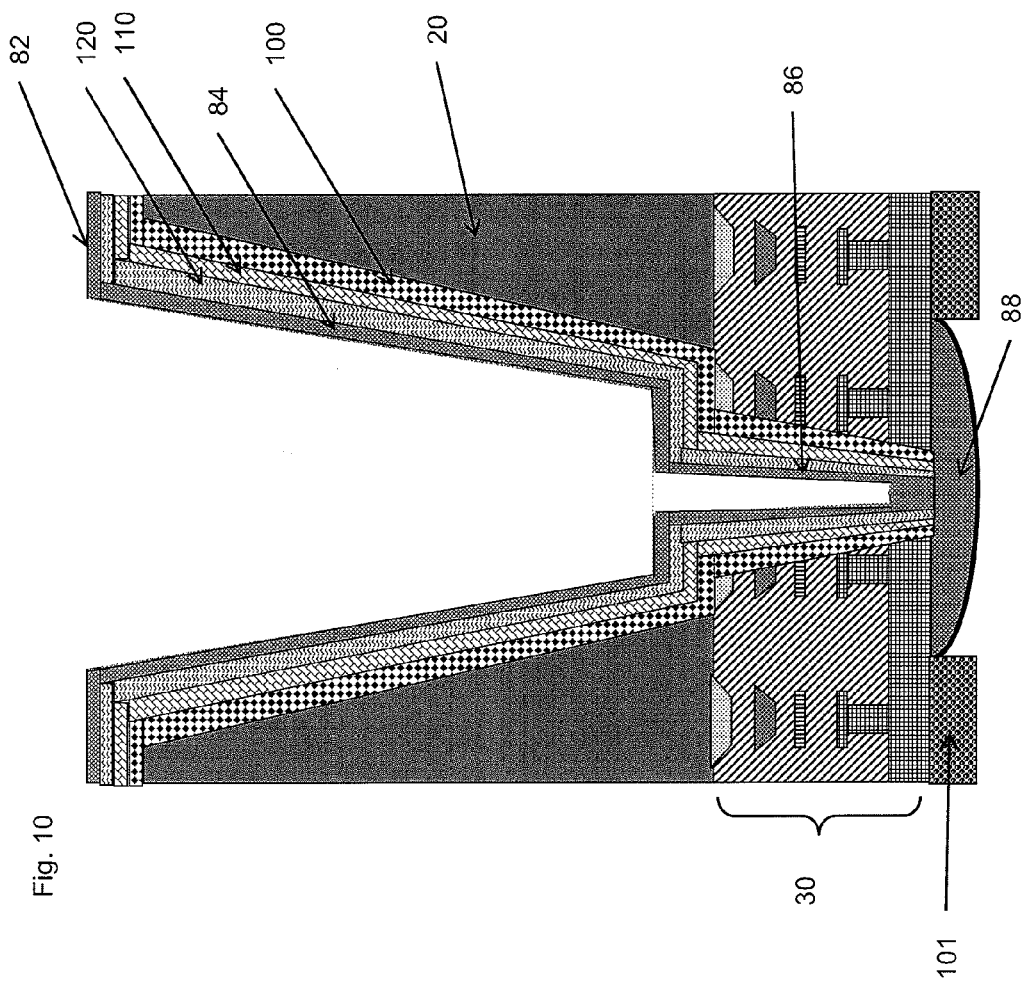

In the step of FIG. 8 an insulation layer 100 is deposited on the inner side walls of the via hole. The insulation layer may comprise a polymer material. In FIG. 9, thin metal layers including barrier layer 110 and sputtered layer 120 are deposited inside the via hole. In FIG. 10 the electroplated layer is added. A bottom up electroplating process is used. In general, 'bottom up' electroplating means that the deposition rate of plated metal at the bottom of the via (near surface 12) will be faster than the upper part of the via. Thus the parts near surface 12 (of the active region) are closed first by electroplated metal and the parts near surface 11 may still be open after the electroplating. Compared to other electroplating methods such as conformal or top down methods, the bottom up process has the advantage that voids are less likely to form in the via. Further, in this case no special chemicals are needed to induce the bottom up electroplating or suppress electroplating at the top; the fact that the second part 60b of the via hole is narrower than the first part 60a causes the bottom up process to occur naturally as the 'bottom' parts fill up more quickly. The electroplating forms an electroplated layer that is generally I-shaped and comprises first 84, 86, second 82 and third 88 portions that are integrally formed. The second portion extends over the first surface 11 of the device, the first portion extends through the device and the third portion extends over the second surface 12 of the device.

Figure 11:
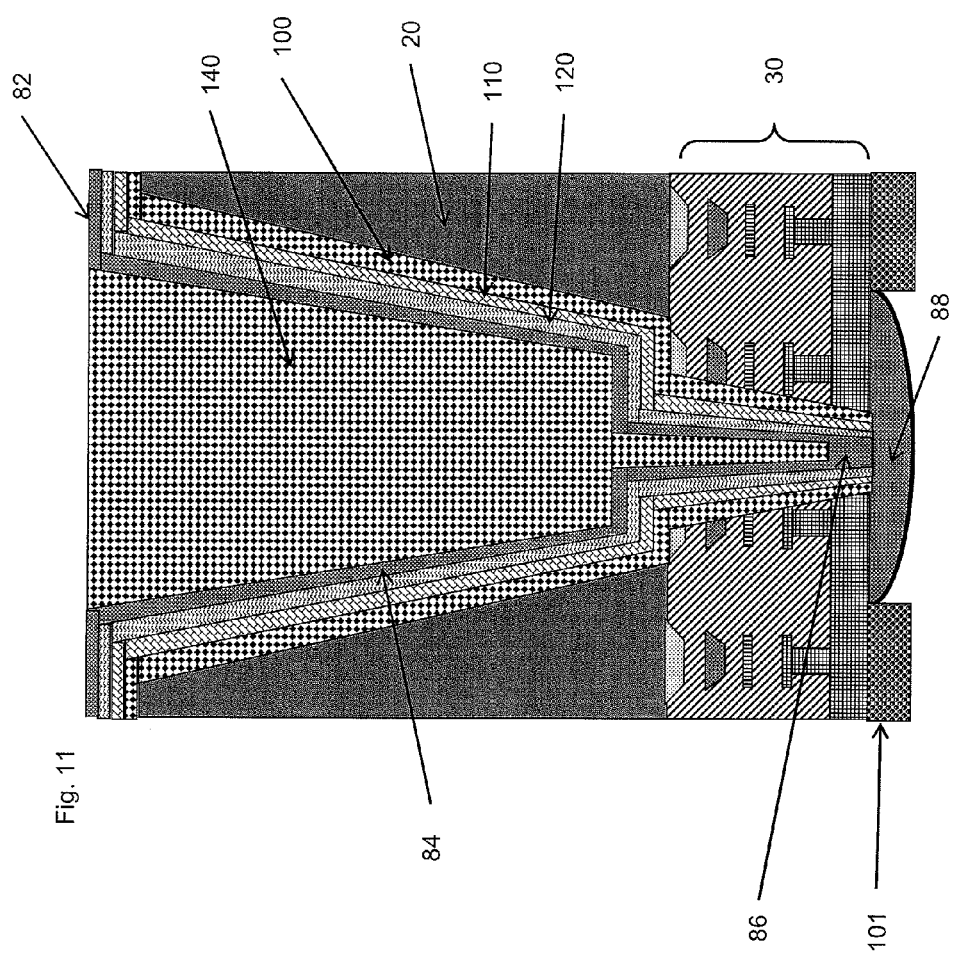

In FIG. 11 a filler in the form of an 'inner' polymer layer 140 is added. The via thus has a metal-polymer-metal structure because the inner polymer layer is surrounded by the electroplated metal layer.

Figure 12:
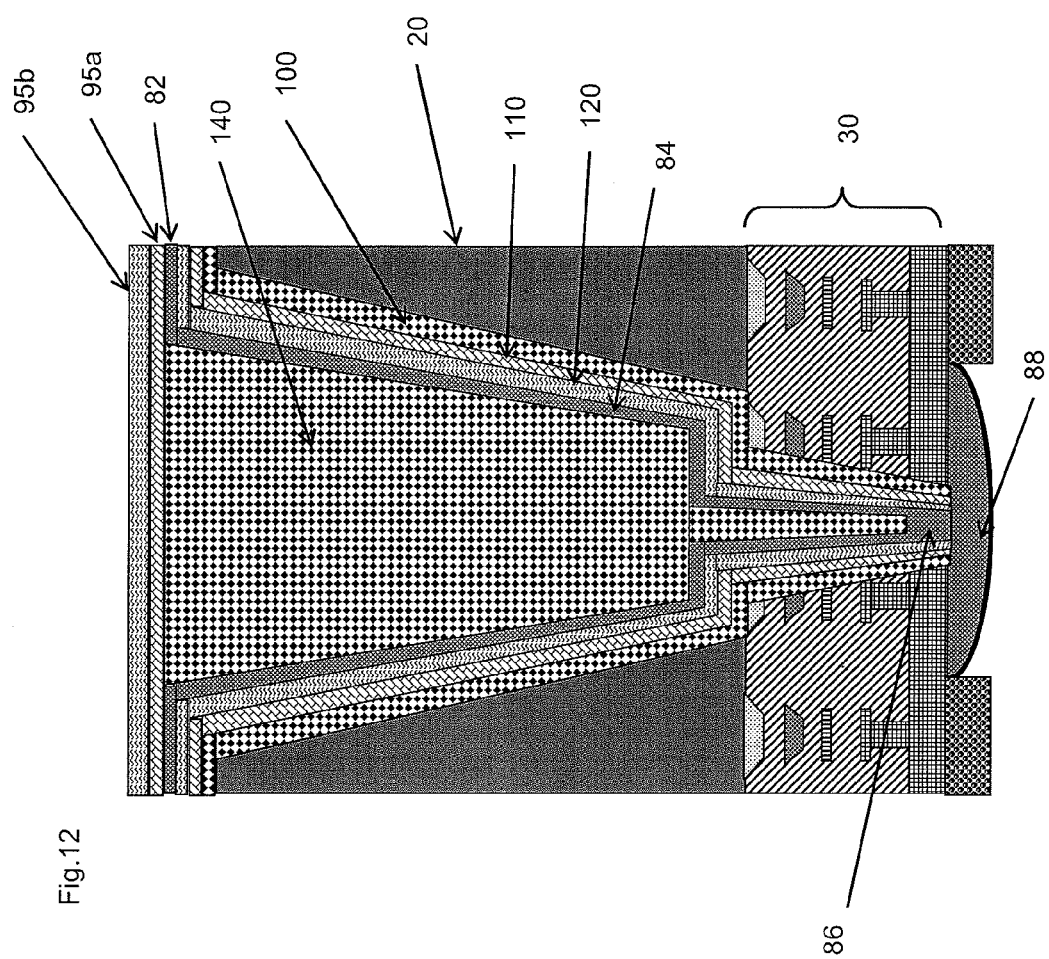
Figure 13:
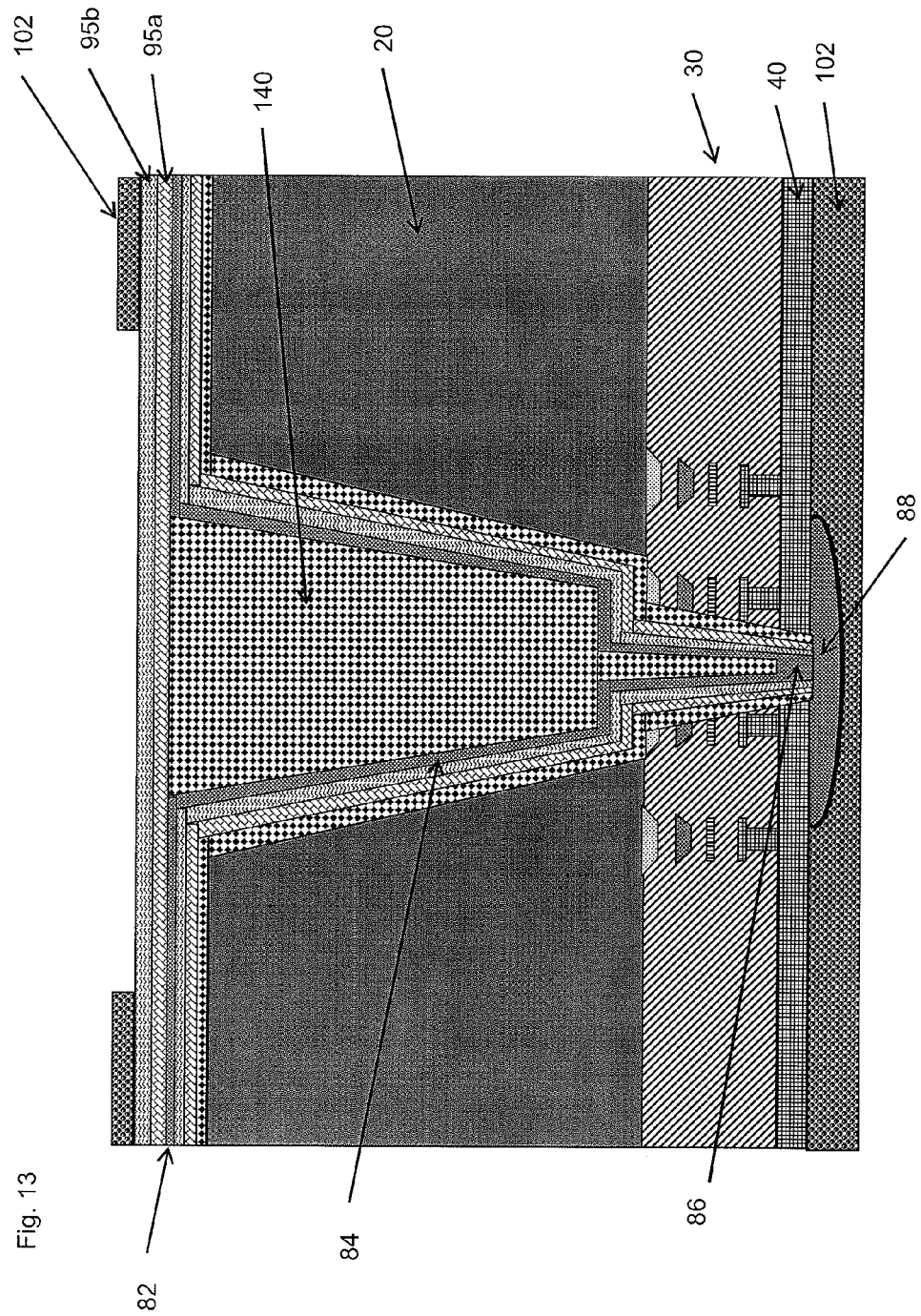
Figure 14:
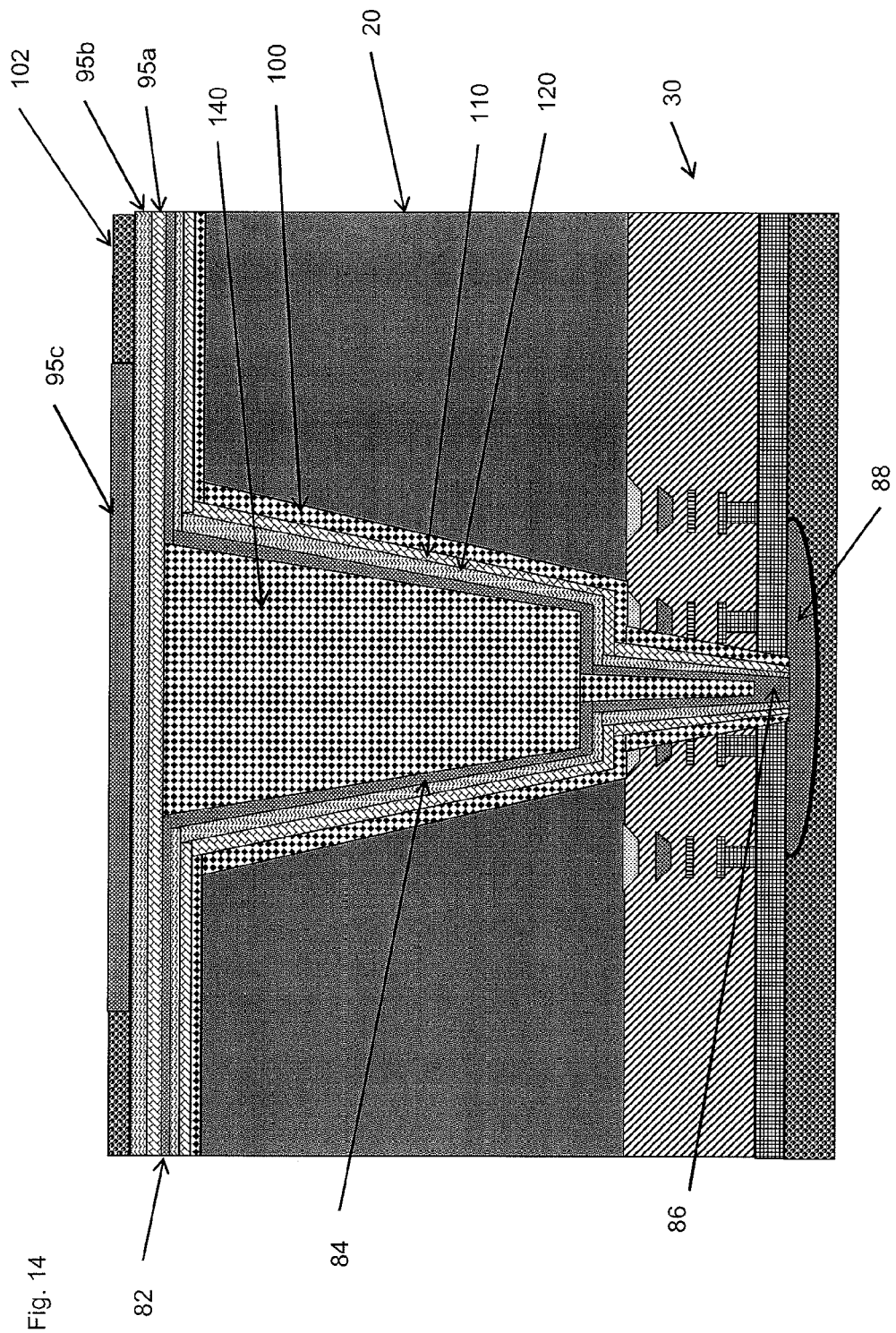
Figure 15:
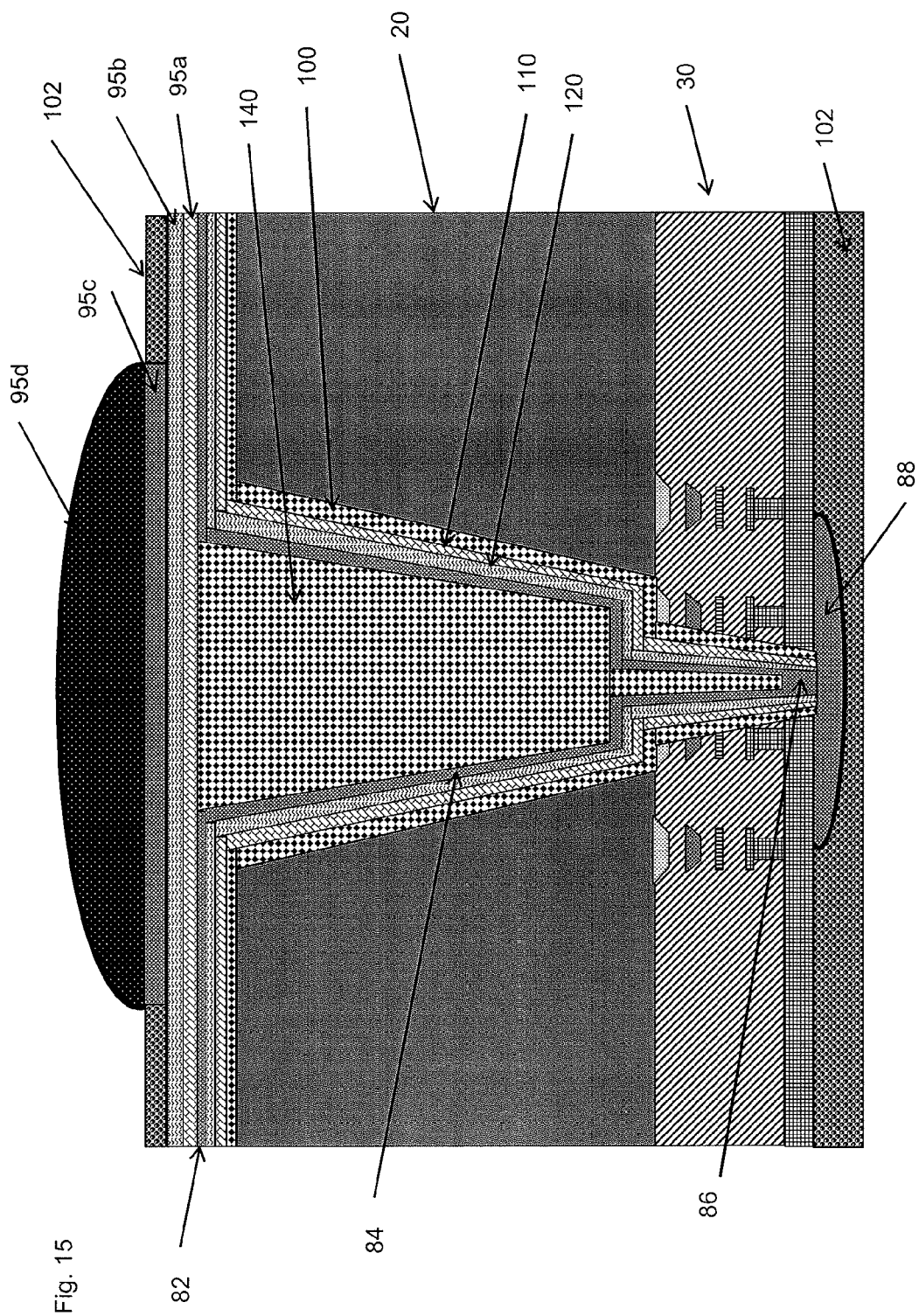
Figure 16:
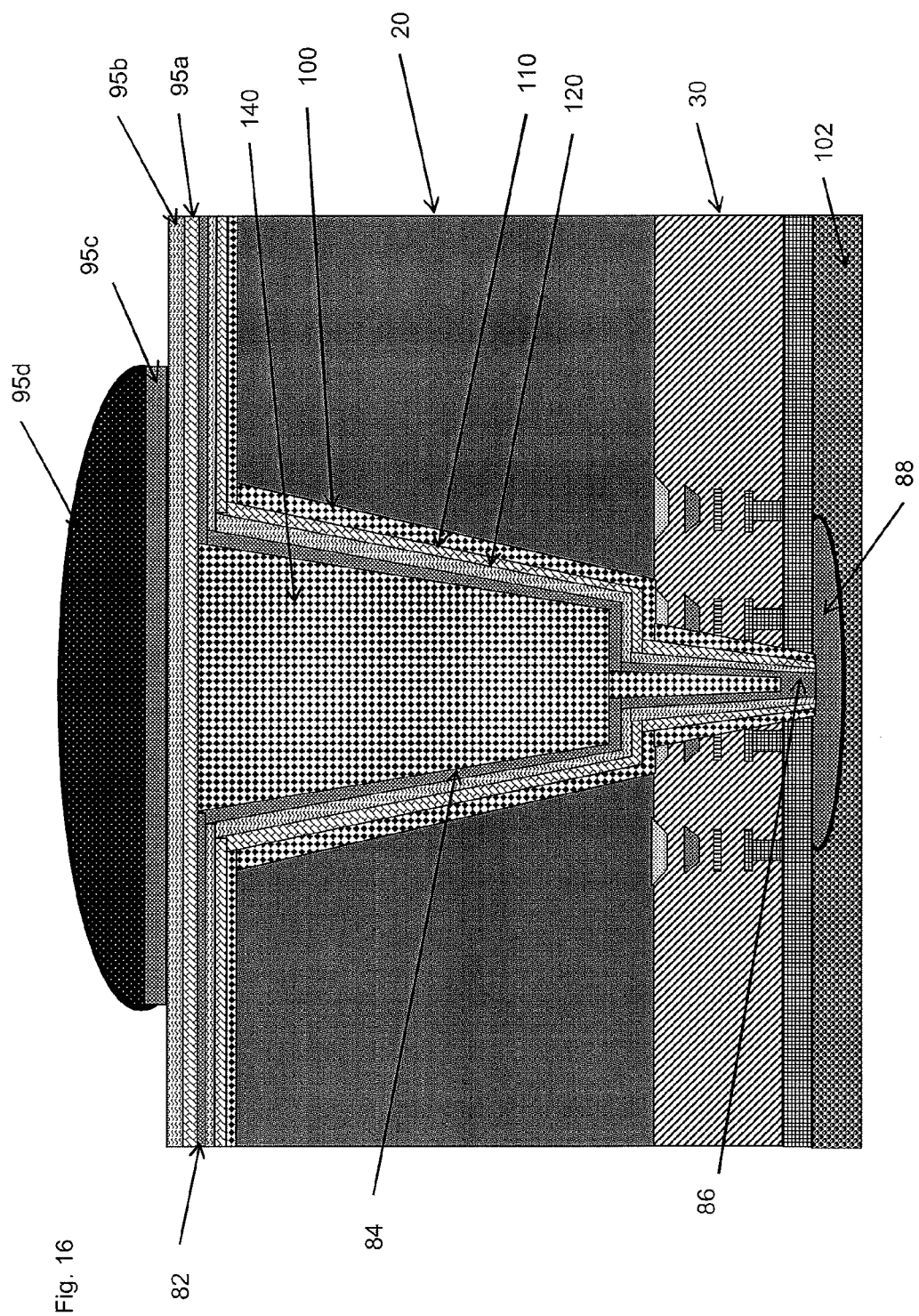
Figure 17:
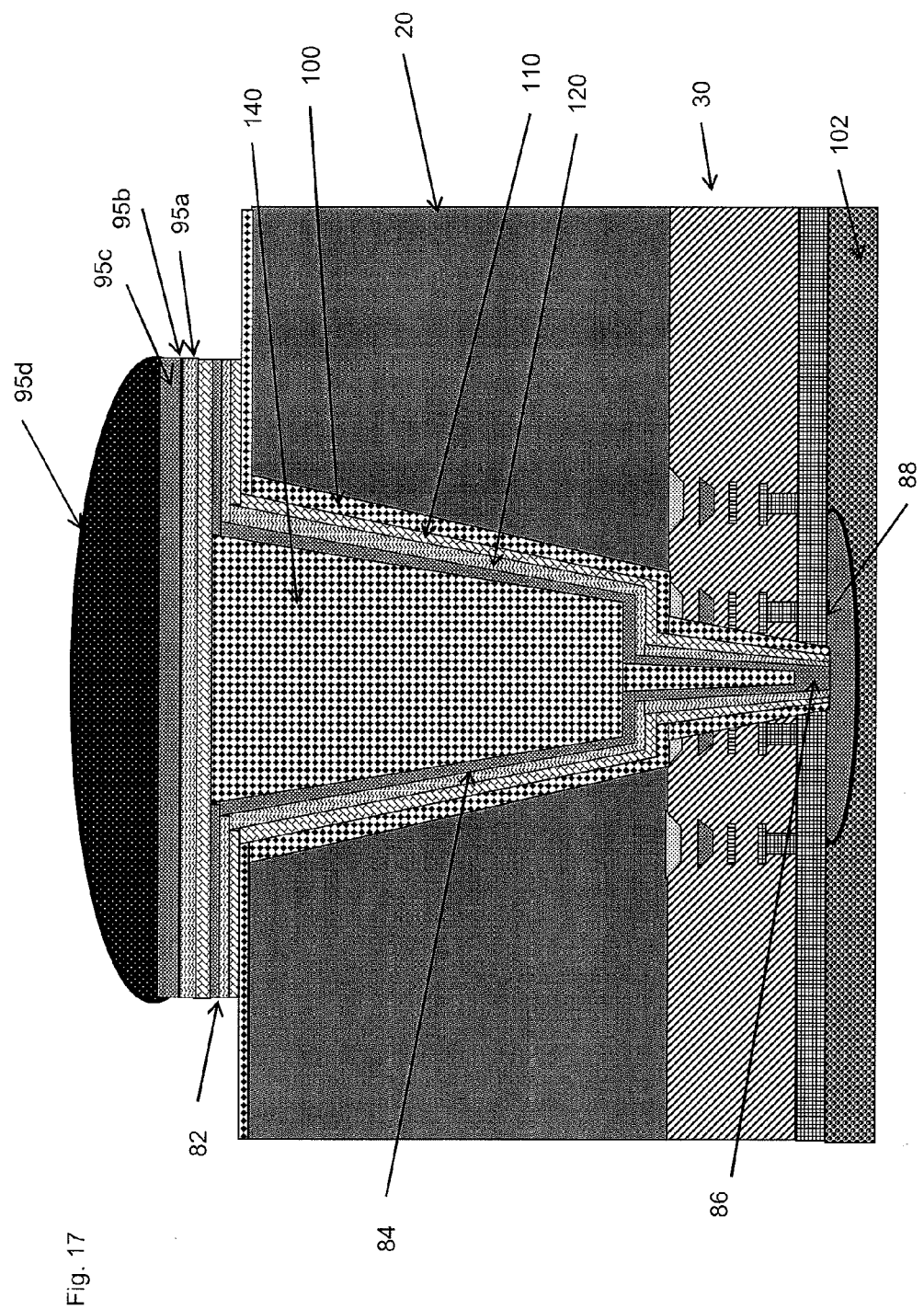
Figure 18:
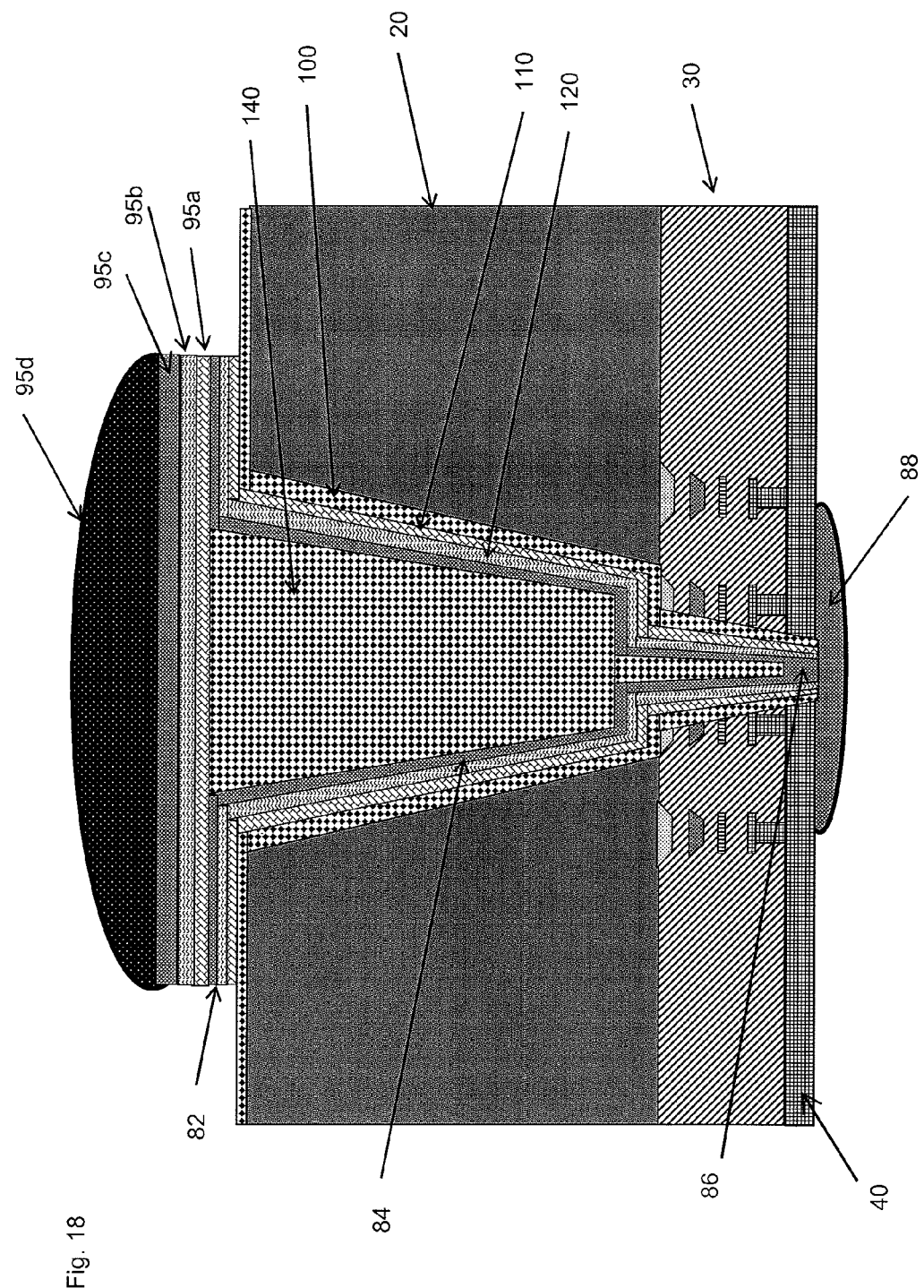
Figure 19:
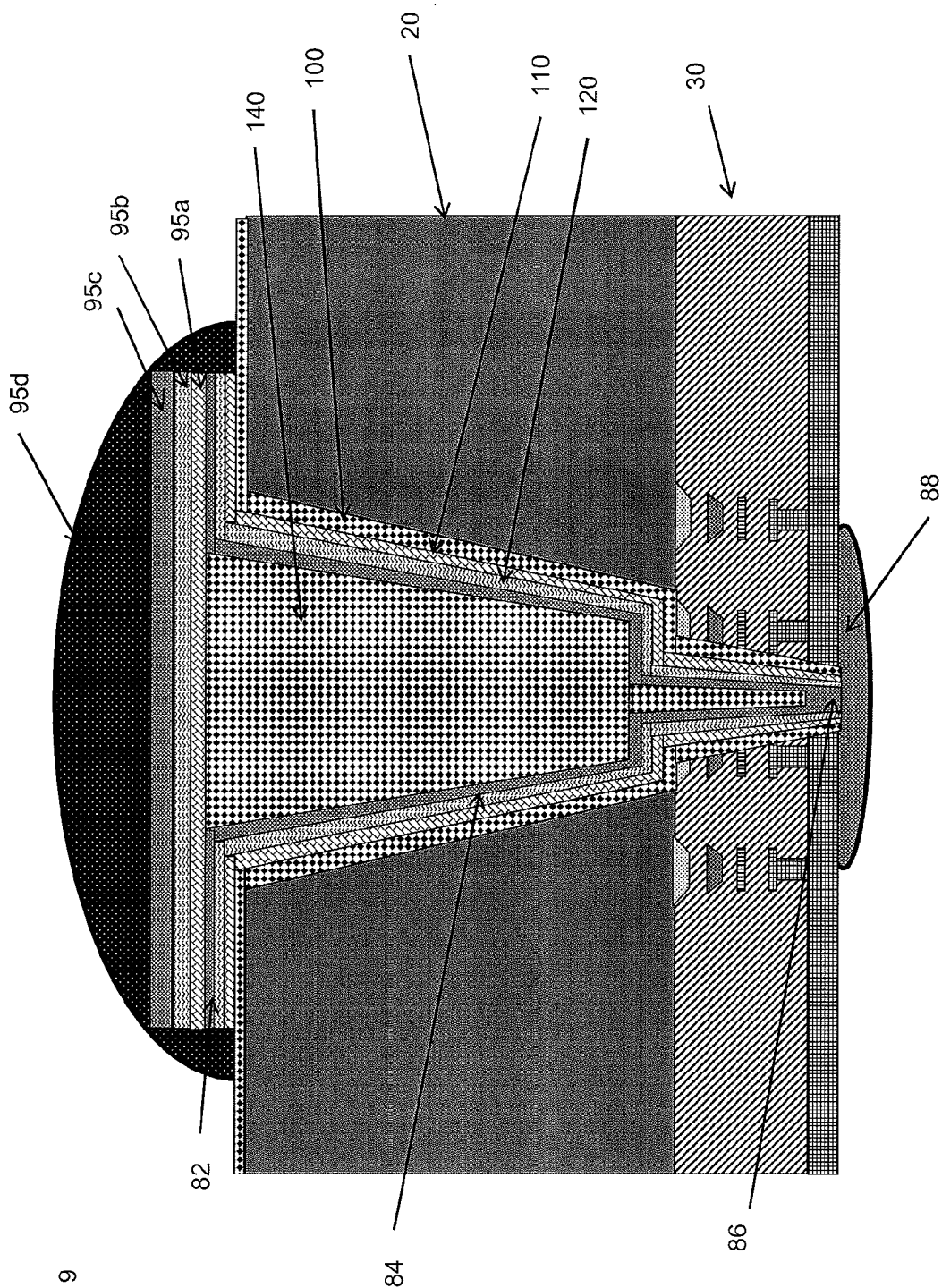

In FIG. 12 a barrier layer 95a and sputtered metal layer 95b are added to the first surface 11. In FIG. 13 a photo resist 102 is spin coated to the first and second surfaces 11, 12. In FIG. 14 a further electroplated layer 95c is added on top of the sputtered metal layer 95b. In FIG. 15 solder 95d is added on top of the further electroplated layer 95c. In FIG. 16 the photo resist is removed from the first surface 11. In FIG. 17 unwanted portions of the upper thin metal layers (to the sides of the via) are etched away. In FIG. 18 the photo resist is removed from the second surface 12. In FIG. 19 the solder is caused to flow around the thin metal layers 95a-c on top of the first surface 11.

The device 20, 30 thus has a via extending though it (a TSV). The third portion 88 of the first electroplated layer and the further electroplated layer 95c of the via may be used as electrical contacts for connecting the device with another device above or below the device 20, 30. Usually solder 95d will be applied to the further electroplated layer and solder 250 may be applied to the third portion 88 as well in order to facilitate the electrical connection. Two stacked devices are shown in FIG. 20.

The first device has a non active layer 200a and an active layer 200b. The second device has a non active layer 300a and an active layer 300b. A first via 210 extends through a left side of the first device and connects with a second via 220 which extends through a left side of the second device. A third via 230 extends through a right side of the first device (laterally spaced from the first via 210). The third via 230 connects with a fourth via 240 which extends through a right side of the second device.

Figure 20:
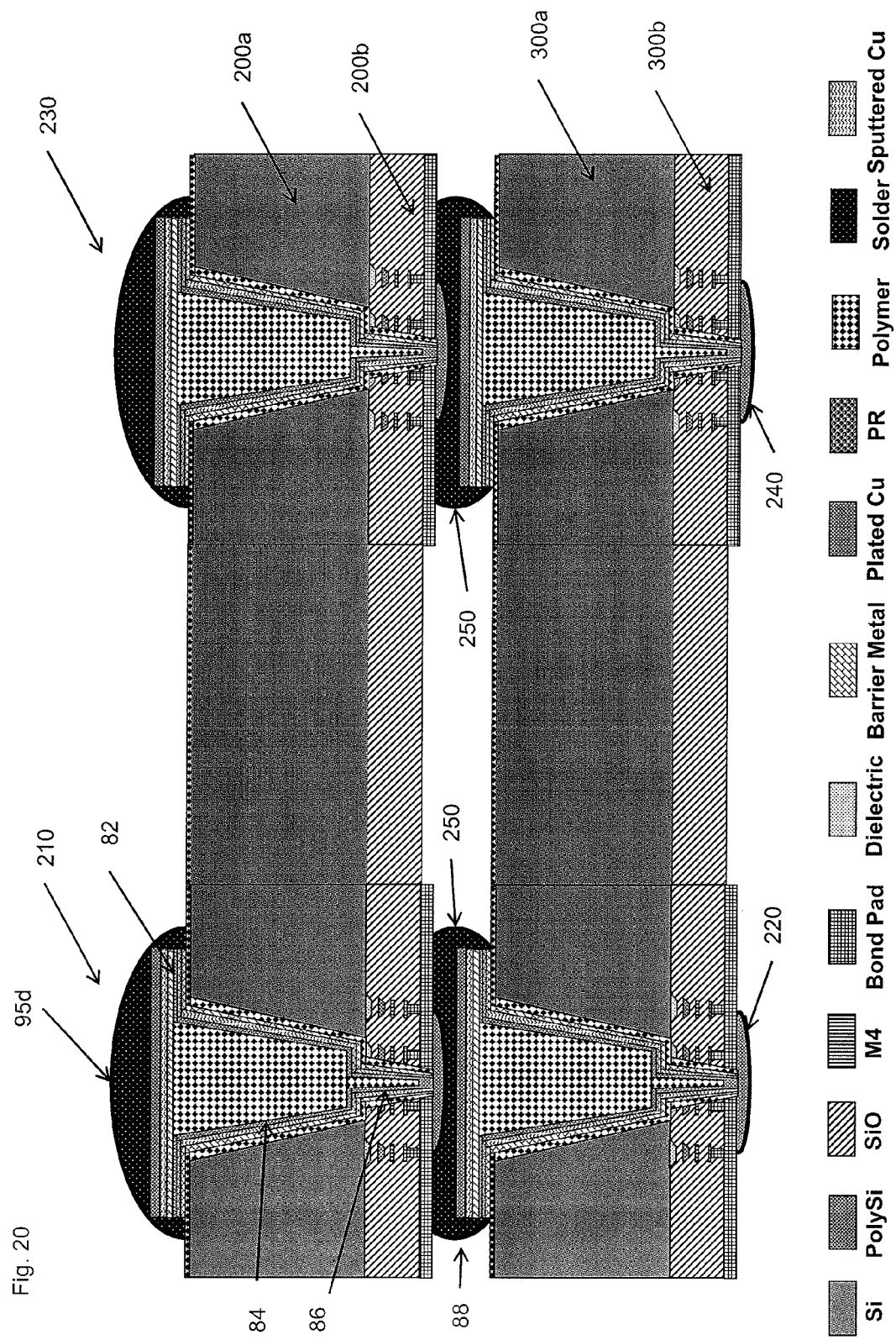
FIG. 20 shows a pair of stacked devices having vias according to an embodiment of the present invention.

While the stacking arrangement of FIG. 20 has just two devices, more devices could be stacked one on top of another. Further, while both of the devices shown in FIG. 20 have vias with the features of the embodiment of FIG. 3, this is not essential. The vias could have the features of other embodiments or a combination thereof. Further, while it is preferable that both devices have one or more vias according to the present invention, it is possible that the one of the devices has prior art type vias or does not have vias at all but just electrical surface features for connection to the via or vias of the first device.

The accompanying figures and above described methods and devices are only preferred embodiments and should not be taken to limit the present invention. Modifications and equivalents to the specifically described structures, materials and methods, will be apparent to a person skilled in the art and are within the scope of the invention which is defined by the appended claims.

The invention claimed is:

1. An electronic or micromechanical device having first and second surfaces and a via extending through the device from the first surface to the second surface; the via comprising a layer having integrally formed first, second and third portions; the first portion extending from the first surface to the second surface; the second portion extending over a part of the first surface of the device and the third portion extending over a part of the second surface of the device.

2. The device of claim 1 wherein the layer is an electroplated metal layer.

3. The device of claim 1 wherein the first, second and third portions of the layer comprises a first electroplated layer and wherein a further electroplated layer is formed over the first surface of the device.

4. The device of claim 3 wherein a barrier layer is provided between said first electroplated layer and said further electroplated layer.

5. The device of claim 1 wherein the first portion of the via comprises a first part and a second part; the first part having a greater cross sectional area than the cross sectional area of the second part.

6. The device of claim 1 wherein the first part is tapered.

7. The device of claim 1 wherein the second part is tapered.

8. The device of claim 1 wherein the via fill comprises a polymer filler.

9. The device of claim 8 wherein the polymer filler is surrounded by a conducting layer.

10. The device of claim 1 wherein the device is stacked on top of or beneath a second device or substrate and electrically connected to the second device by the via.

11. A method of forming a via extending through an electronic or micromechanical device having a first surface and a second surface; the method comprising forming a via hole extending all the way through the device from the first surface to the second surface and adding an integrally formed metal layer extending through said via hole from said first surface to said second surface; said integrally formed metal layer comprising a portion which extends over part of said first surface of the device and a portion which extends over a part of said second surface of the device.

12. The method of claim 11 comprising adding a polymer layer inside the metal layer.

13. The method of claim 11 wherein the electroplating is carried out by a bottom up process.

14. The method of claim 11 wherein the method further comprises the step of stacking said device on top of or beneath a second device, such that said device and said second device are electrically connected by the via.

15. An electronic or micromechanical device having first and second surfaces and a via extending through the device from the first surface to the second surface; wherein the device has a non-active layer and an active layer and wherein the a first part of the via extends through the non-active layer and a second part of the via extends primarily through the active layer; the first part of the via having a greater width than the second part of the via.

16. The device of claim 15 wherein the via comprises a polymer layer and a metal electroplated layer surrounding the polymer layer; said polymer and electroplated layers both extending though the active and non-active layers of the device.

17. A method of forming a via extending through an electronic or micromechanical device from a first surface to a second surface, comprising:

forming a first part of the via extending through a non-active layer of the device;

forming a second part of the via extending primarily through an active layer of the device;

wherein the first part of the via having a greater width than the second part of the via.

18. The method of claim 17 wherein the second part of the via hole extends through at least part of an active region of the device.

19. The method of claim 18 wherein the active region of the device comprises a bond pad.

20. The method of claim 17 wherein the second part of the via hole has a smaller width than the first part of the via hole.

21. The method of claim 17 further comprising the step of electroplating to fill or partially fill the via hole with a layer of conductive metal.

22. The method of claim 21 further comprising adding a polymer layer inside the conductive metal layer.

* * * * *